(12) United States Patent
Sugimoto

(10) Patent No.: US 8,547,663 B2
(45) Date of Patent: Oct. 1, 2013

(54) SUSPENSION BOARD WITH CIRCUIT HAVING AN ELECTRICALLY CONDUCTIVE LAYER INTERPOSED BETWEEN A SUPPORT TERMINAL AND METAL PLATING LAYER

(75) Inventor: Yuu Sugimoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 29 days.

(21) Appl. No.: 13/317,599

(22) Filed: Oct. 24, 2011

(65) Prior Publication Data

US 2012/0113547 A1    May 10, 2012

Related U.S. Application Data

(60) Provisional application No. 61/457,032, filed on Dec. 13, 2010.

(30) Foreign Application Priority Data

Nov. 10, 2010    (JP) .................................. 2010-251655

(51) Int. Cl.
*G11B 5/48* (2006.01)
*H05K 1/09* (2006.01)

(52) U.S. Cl.
USPC ...................... 360/245.9; 360/264.2; 174/250

(58) Field of Classification Search
USPC ..... 360/245.8, 245.9, 264.2, 234.5; 174/250, 174/254, 255, 263
See application file for complete search history.

(56) References Cited

U.S. PATENT DOCUMENTS

| | | | |
|---|---|---|---|
| 5,744,758 A * | 4/1998 | Takenouchi et al. .......... | 174/255 |
| 6,399,899 B1 * | 6/2002 | Ohkawa et al. ............... | 174/261 |
| 6,841,737 B2 * | 1/2005 | Komatsubara et al. ....... | 174/250 |
| 7,465,884 B2 * | 12/2008 | Ooyabu et al. ................ | 174/255 |
| 7,737,365 B2 * | 6/2010 | Ishii et al. ..................... | 174/254 |
| 8,014,103 B2 * | 9/2011 | Ohsawa et al. ............ | 360/234.6 |
| 8,247,700 B2 * | 8/2012 | Ishii et al. ..................... | 174/254 |
| 8,300,364 B2 * | 10/2012 | Ogawa ....................... | 360/245.9 |
| 8,330,054 B2 * | 12/2012 | Honjo et al. .................. | 174/260 |
| 8,379,349 B1 * | 2/2013 | Pro et al. .................... | 360/245.9 |
| 8,390,958 B2 * | 3/2013 | Ohnuki et al. ............ | 360/245.9 |
| 8,395,866 B1 * | 3/2013 | Schreiber et al. .......... | 360/245.9 |
| 2008/0190652 A1 | 8/2008 | Kamei et al. | |
| 2008/0278858 A1 * | 11/2008 | Ishii et al. .................. | 360/245.9 |

(Continued)

FOREIGN PATENT DOCUMENTS

| | | |
|---|---|---|
| JP | 06-158384 | 6/1994 |
| JP | 07-170043 | 7/1995 |
| JP | 2008-198738 | 8/2008 |

*Primary Examiner* — Brian Miller
(74) *Attorney, Agent, or Firm* — Jean C. Edwards, Esq.; Edwards Neils PLLC

(57) ABSTRACT

A suspension board with circuit includes a metal supporting board; an insulating layer formed on the metal supporting board having an opening penetrating in the thickness direction formed therein; and a conductive pattern formed on the insulating layer including an external-side terminal electrically connected to an external board. The external-side terminal is filled in the opening of the insulating layer. In the metal supporting board, a support terminal electrically insulated from the surrounding metal supporting board and electrically connected to the external-side terminal is provided. The suspension board with circuit includes a metal plating layer formed below the support terminal and an electrically-conductive layer interposed between the support terminal and the metal plating layer having a thickness of 10 nm or more to 200 nm or less.

7 Claims, 6 Drawing Sheets

(56) References Cited

U.S. PATENT DOCUMENTS

2009/0255717 A1* 10/2009 Mizushima et al. .......... 174/255
2011/0284274 A1* 11/2011 Kamei et al. ................. 174/257
2012/0113547 A1* 5/2012 Sugimoto .................. 360/245.8
2012/0224281 A1* 9/2012 Arai ........................... 360/244.2
2012/0247824 A1* 10/2012 Ohsawa ........................ 174/264
2013/0010392 A1* 1/2013 Yamada et al. ............ 360/245.9

* cited by examiner

Front Side ←→ Rear Side

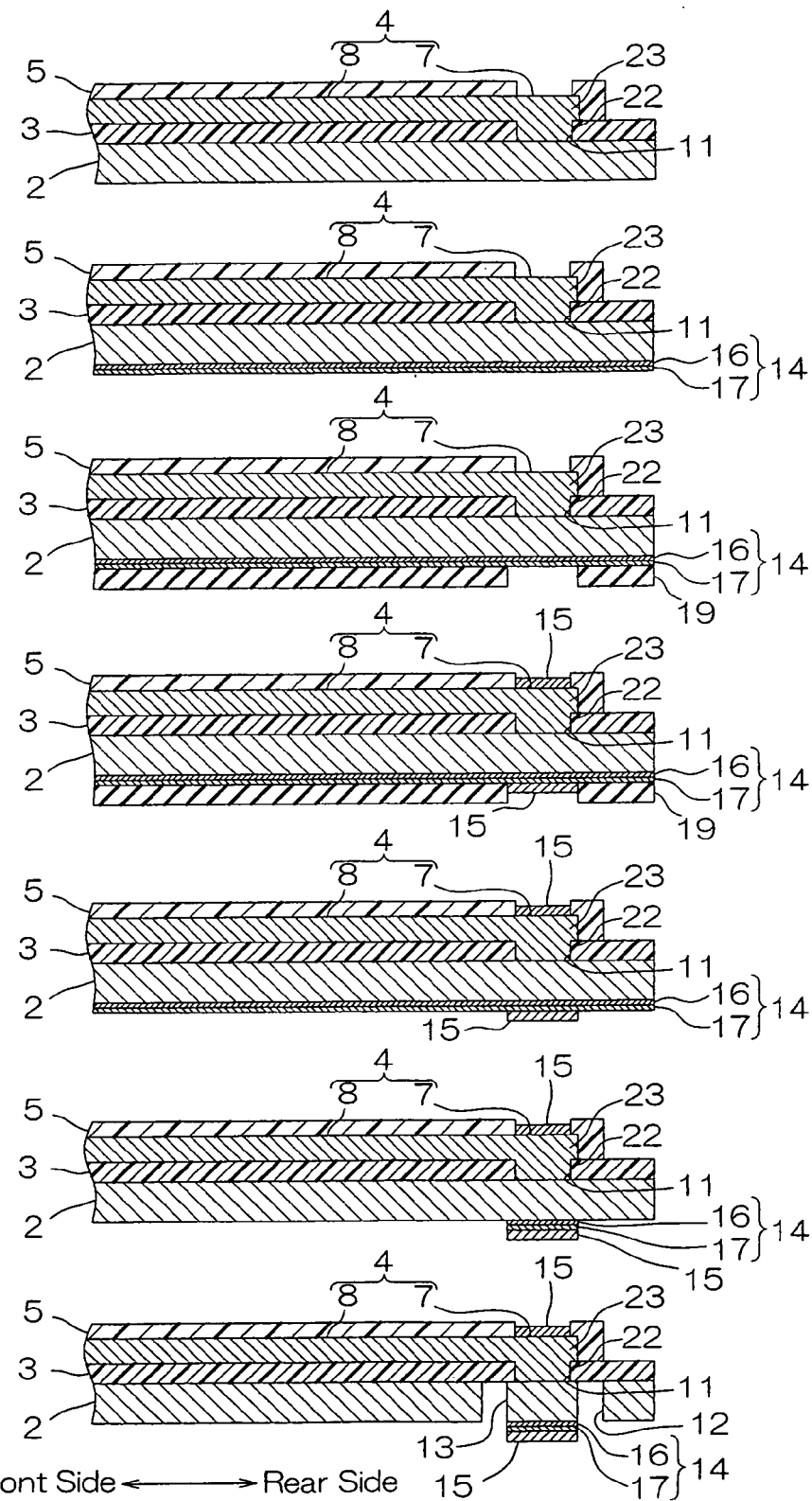

SUSPENSION BOARD WITH CIRCUIT HAVING AN ELECTRICALLY CONDUCTIVE LAYER INTERPOSED BETWEEN A SUPPORT TERMINAL AND METAL PLATING LAYER

CROSS-REFERENCE TO RELATED APPLICATION

The present application claims the benefit of U.S. Provisional Application No. 61/457,032 filed on Dec. 13, 2010, and claims priority from Japanese Patent Application No. 2010-251655 filed on Nov. 10, 2010, the contents of which are hereby incorporated by reference into this application.

BACKGROUND OF THE INVENTION

1. Field of the Invention

The present invention relates to a suspension board with circuit and a producing method thereof, to be specific, to a suspension board with circuit that is mounted on a hard disk drive and a producing method thereof.

2. Description of Related Art

A suspension board with circuit is electrically connected to a magnetic head and an external board, and the suspension board with circuit is mounted on a hard disk drive. The suspension board with circuit includes a metal supporting board made of stainless steel and the like, an insulating base layer that is formed thereon, and a conductive pattern that is formed thereon. The conductive pattern includes a head-side terminal that is electrically connected to the magnetic head, an external-side terminal that is electrically connected to the external board, an inspection-side terminal that is used in an inspection, and a wire that is connected thereto.

The magnetic head is mounted on the suspension board with circuit so as to be electrically connected to the head-side terminal. Thereafter, the conduction of the conductive pattern and the performance of the magnetic head are inspected by allowing a probe of an inspection device to come into contact with the inspection-side terminal.

It has been known that in the surface of the terminal, a gold plating layer is formed (ref: for example, Japanese Unexamined Patent Publication No. 2008-198738).

SUMMARY OF THE INVENTION

In the above-described inspection, depending on the arrangement of the inspection device, it may be difficult to dispose the probe above the inspection-side terminal. In that case, it is considered that the probe is disposed below the inspection-side terminal. In such a case, it is considered that the probe comes into contact with the lower surface of the terminal after the terminal is formed in the metal supporting board and the magnetic head and the terminal are conducted to each other.

The terminal made of stainless steel has a high surface resistance, so that, as is the case with Japanese Unexamined Patent Publication No. 2008-198738, it is considered that the conductivity between the probe and the terminal is improved by forming the gold plating layer on the lower surface of the terminal and allowing the probe to come into contact with the gold plating layer.

However, there is a disadvantage that when adhesion between the gold plating layer and the terminal is not sufficient, the gold plating layer easily peels off from the terminal.

It is an object of the present invention to provide a suspension board with circuit in which an inspection of the conduction of a conductive pattern and the performance of a magnetic head can be performed with excellent reliability by improving adhesion between a metal plating layer and a support terminal, and a producing method thereof.

A suspension board with circuit of the present invention includes a metal supporting board; an insulating layer formed on the metal supporting board having an opening penetrating in the thickness direction formed therein; and a conductive pattern formed on the insulating layer including a head-side terminal electrically connected to a magnetic head, an external-side terminal electrically connected to an external board, and a wire connected to the head-side terminal and the external-side terminal, wherein the external-side terminal is filled in the opening of the insulating layer, and in the metal supporting board, a support terminal electrically insulated from the surrounding metal supporting board and electrically connected to the external-side terminal is provided, wherein the suspension board with circuit includes a metal plating layer formed below the support terminal and an electrically-conductive layer interposed between the support terminal and the metal plating layer having a thickness of 10 nm or more to 200 nm or less.

In the suspension board with circuit of the present invention, it is preferable that the electrically-conductive layer is made of a metal and is a deposition layer that is formed by a vacuum deposition method.

In the suspension board with circuit of the present invention, it is preferable that the electrically-conductive layer is made of at least one metal selected from the group consisting of chromium, copper, molybdenum, tungsten, and nichrome.

In the suspension board with circuit of the present invention, it is preferable that the electrically-conductive layer includes a first electrically-conductive layer that is made of at least one metal selected from the group consisting of chromium, molybdenum, tungsten, and nichrome and is next to the support terminal, and a second electrically-conductive layer that is made of copper and is formed below the first electrically-conductive layer so as to be next to the metal plating layer.

In the suspension board with circuit of the present invention, it is preferable that the metal supporting board is made of stainless steel.

In the suspension board with circuit of the present invention, it is preferable that the metal plating layer is made of gold and/or nickel.

In the suspension board with circuit of the present invention, it is preferable that the metal plating layer includes a gold plating layer that is formed of gold.

In the suspension board with circuit of the present invention, it is preferable that the metal plating layer includes a nickel plating layer that is formed below the electrically-conductive layer and is made of nickel, and a gold plating layer that is formed below the nickel plating layer and is made of gold.

The method for producing a suspension board with circuit of the present invention includes the steps of preparing a metal supporting board; forming, on the metal supporting board, an insulating layer having an opening penetrating in the thickness direction formed therein; and forming, on the insulating layer, a conductive pattern including a head-side terminal electrically connected to a magnetic head, an external-side terminal electrically connected to an external board, and a wire connected to the head-side terminal and the external-side terminal, wherein in the step of forming the conductive pattern, the external-side terminal is filled in the opening of the insulating layer, wherein the method includes the steps of forming, in the metal supporting board, a support terminal electrically insulated from the surrounding metal supporting board and electrically connected to the external-side terminal; forming, below the support terminal, an electrically-conductive layer having a thickness of 10 nm or more to 200 nm or less, and forming a metal plating layer below the electrically-conductive layer.

According to the suspension board with circuit of the present invention obtained by the method for producing the suspension board with circuit of the present invention, the external-side terminal is filled in the opening of the insulating layer; in the metal supporting board, the support terminal electrically insulated from the surrounding metal supporting board and electrically connected to the external-side terminal is formed; and the metal plating layer is formed below the support terminal, so that, when the probe of the inspection device is allowed to come into contact with the lower surface of the metal plating layer from the lower side thereof, it is possible to ensure excellent conductivity between the probe and the support terminal and to inspect the conduction of the conductive pattern and the performance of the magnetic head that is connected to the head-side terminal.

The electrically-conductive layer with a specific thickness is interposed between the support terminal and the metal plating layer, so that the adhesion between the support terminal and the metal plating layer can be improved.

Therefore, it is possible to prevent that the metal plating layer peels off from the support terminal.

As a result, it is possible to improve the reliability of the inspection of the conduction of the conductive pattern and the performance of the magnetic head.

BRIEF DESCRIPTION OF THE DRAWINGS

FIG. 6 shows process drawings for describing a method for producing the suspension board with circuit shown in FIG. 1:

(a) illustrating a step of forming a metal supporting board, an insulating base layer, a conductive pattern, and an insulating cover layer, (b) illustrating a step of forming an electrically-conductive layer, (c) illustrating a step of forming a plating resist, (d) illustrating a step of forming a metal plating layer, (e) illustrating a step of removing the plating resist, (f) illustrating a step of removing the electrically-conductive layer that is exposed from the metal plating layer, and (g) illustrating a step of forming a slit and a support opening and cutting out the metal supporting board along an outer shape thereof.

DETAILED DESCRIPTION OF THE INVENTION

Figure 1:
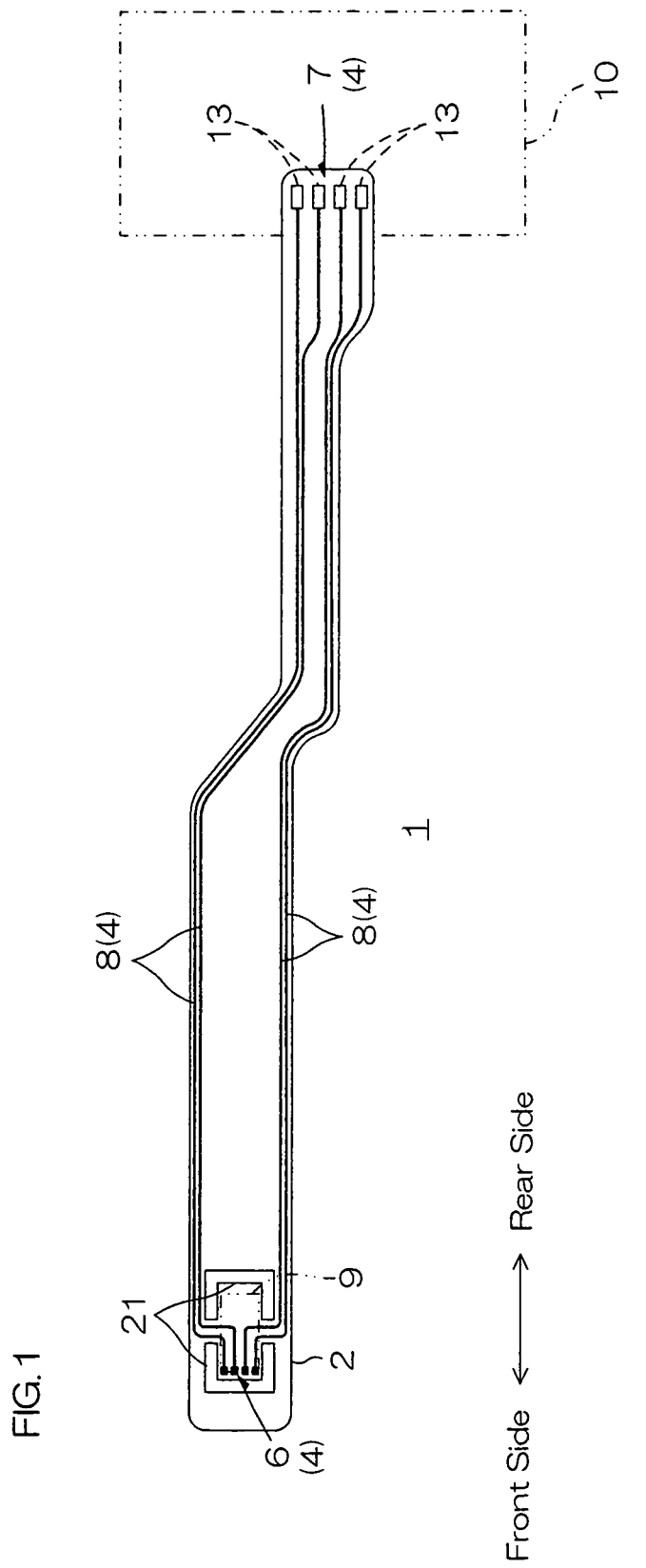
FIG. 1 shows a plan view of one embodiment of a suspension board with circuit of the present invention.
Figure 2:
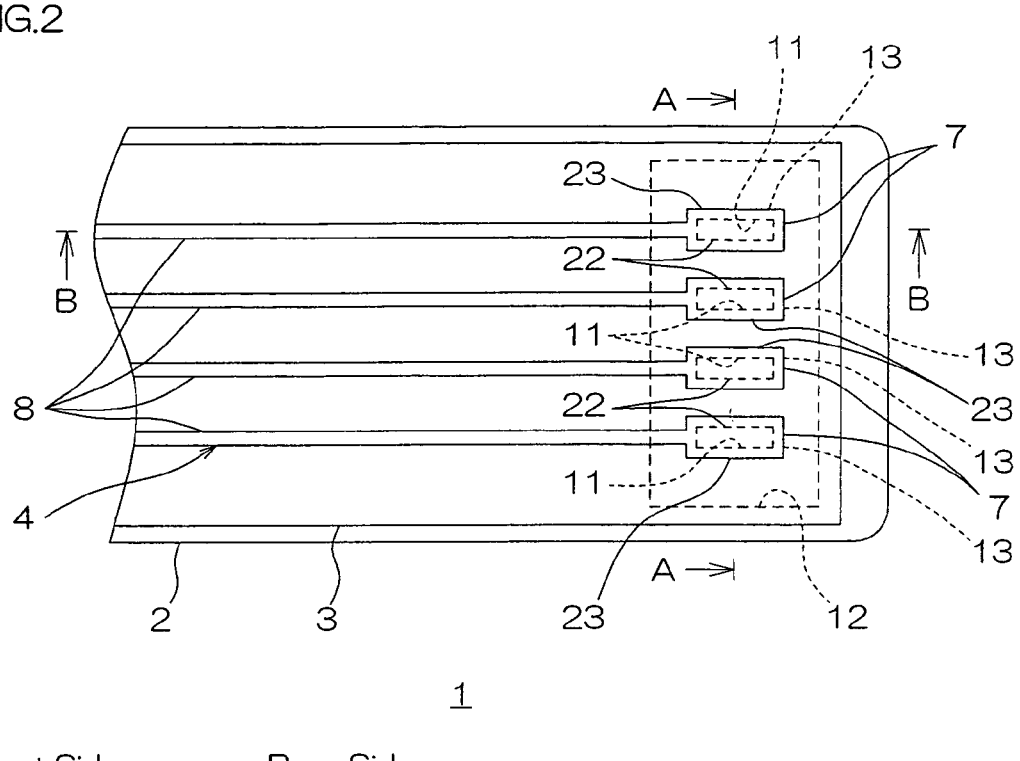
FIG. 2 shows an enlarged plan view of a rear end portion of the suspension board with circuit shown in FIG 1.
Figure 3:
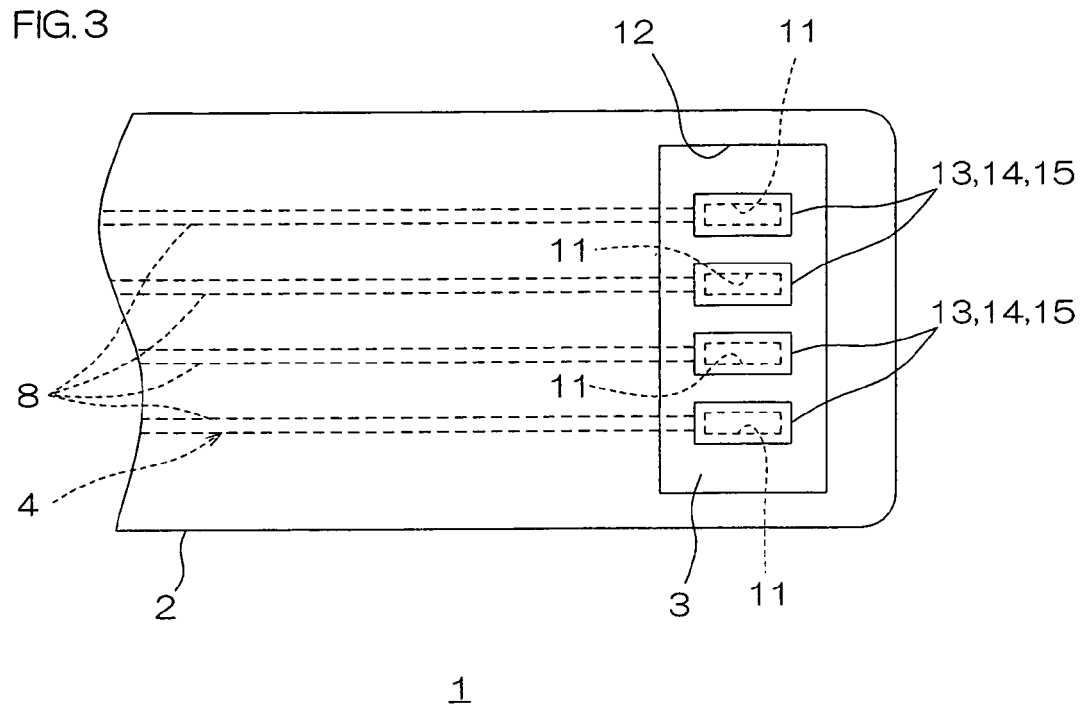
FIG. 3 shows an enlarged bottom view of the rear end portion of the suspension board with circuit shown in FIG. 1.
Figure 4:
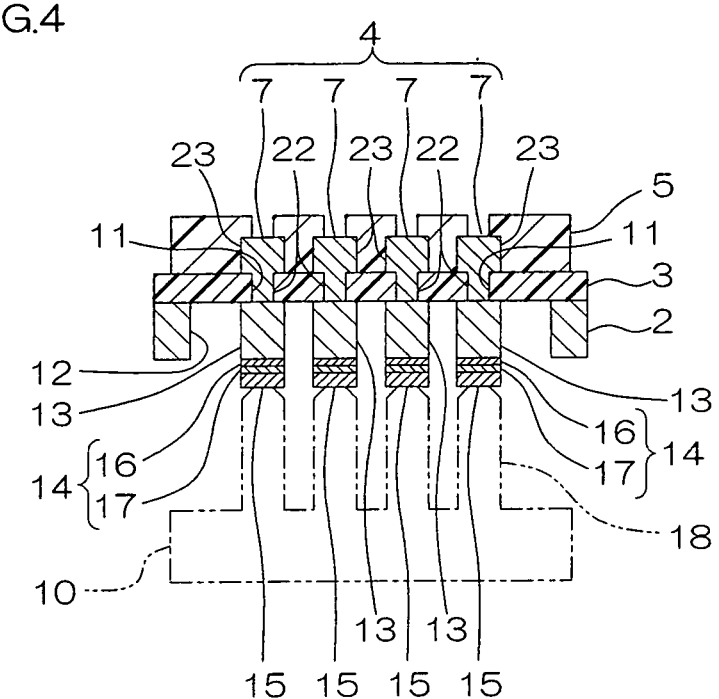
FIG. 4 shows a sectional view of the rear end portion of the suspension board with circuit shown in FIG. 1 and a sectional view, taken along the line A-A in FIG. 2.
Figure 5:
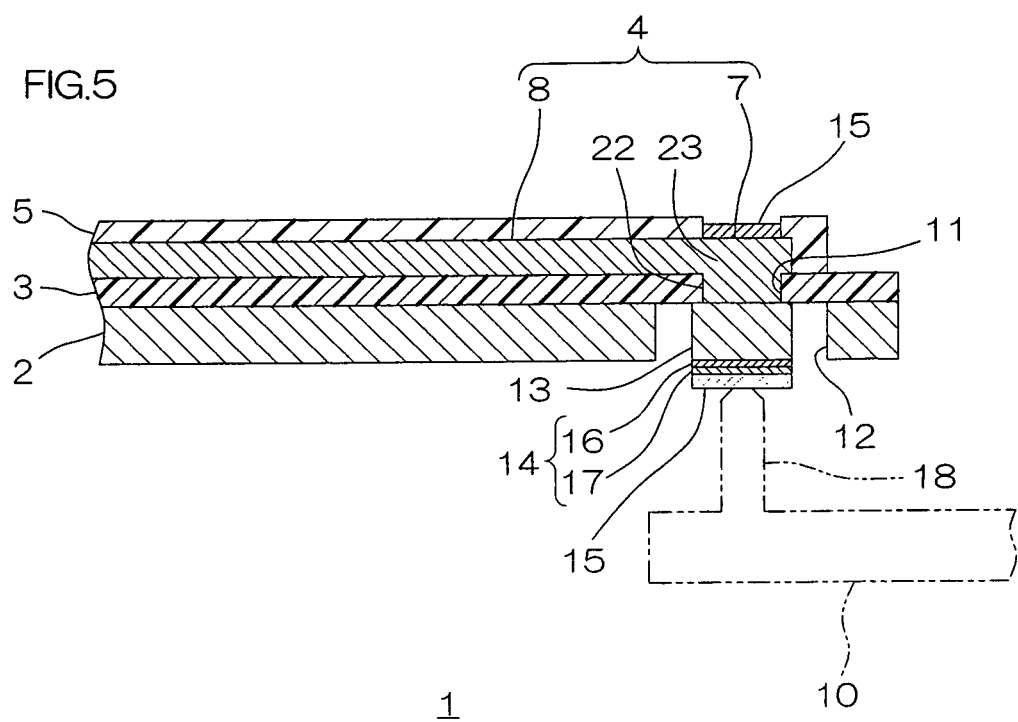
FIG. 5 shows a sectional view of the rear end portion of the suspension board with circuit shown in FIG. 1 and a sectional view, taken along the line B-B in FIG. 2.

FIG. 1 shows a plan view of one embodiment of a suspension board with circuit of the present invention. FIGS. 2 and 3 each show an enlarged plan view and an enlarged bottom view of a rear end portion of the suspension board with circuit shown in FIG. 1. FIGS. 4 and 5 show sectional views of the rear end portion of the suspension board with circuit shown in FIG. 1 and sectional views, each taken along the line A-A and the line B-B in FIG. 2. FIG. 6 shows process drawings for describing a method for producing the suspension board with circuit shown in FIG. 1.

In FIGS. 1 and 2, an insulating cover layer 5 is omitted so as to clearly show the relative arrangement of a conductive pattern 4. In FIG. 1, an insulating base layer 3 is omitted so as to clearly show the relative arrangement of the conductive pattern 4.

In FIG. 1, a suspension board with circuit 1 is mounted with a slider 9 (phantom lines) mounted with a magnetic head and an external board (not shown), and the suspension board with circuit 1 is mounted on a hard disk drive.

The suspension board with circuit 1 is formed into a flat belt shape extending in the lengthwise direction and includes a metal supporting board 2 and the conductive pattern 4 that is supported by the metal supporting board 2.

The metal supporting board 2 is formed into a shape corresponding to a planar shape of the suspension board with circuit 1.

The conductive pattern 4 integrally includes a head-side terminal 6 that is formed on the front end portion (one end portion in the lengthwise direction) of the metal supporting board 2, an external-side terminal 7 that is formed on the rear end portion (the other end portion in the lengthwise direction) of the metal supporting board 2, and a wire 8 that electrically connects the head-side terminal 6 to the external-side terminal 7.

In the metal supporting board 2, a slit 21 that sandwiches the head-side terminal 6 in the front-rear direction is formed so as to penetrate in the thickness direction. As shown in FIGS. 3 to 5, a support opening 12 that surrounds the external-side terminal 7, when projected in the thickness direction, is formed in the metal supporting board 2. The support opening 12 is formed so as to penetrate in the thickness direction and is formed into a generally rectangular shape in plane view that is long in the widthwise direction (the direction perpendicular to the front-rear direction).

As shown in FIGS. 4 and 5, the suspension board with circuit 1 includes the metal supporting board 2, the insulating base layer 3 that is formed on the metal supporting board 2 as an insulating layer, the conductive pattern 4 that is formed on the insulating base layer 3, and the insulating cover layer 5 that is formed on the insulating base layer 3 so as to cover the conductive pattern 4.

Examples of a metal material for forming the metal supporting board 2 include stainless steel, 42-alloy, aluminum, copper-beryllium, or phosphor bronze. Preferably, stainless steel is used.

The stainless steel is steel, for example, containing 12 mass % or more of chromium. For example, SUS304 and the like are used. The specific resistance (20° C.) of the stainless steel is in the range of, for example, 50 to 100 $\mu\Omega\cdot$cm.

The metal supporting board 2 has a thickness in the range of, for example, 15 to 50 μm, or preferably 20 to 30 μm.

The insulating base layer 3 is, on the upper surface of the metal supporting board 2, formed into a pattern corresponding to the conductive pattern 4. An example of an insulating material for forming the insulating base layer 3 includes a synthetic resin such as polyimide resin, polyamide imide resin, acrylic resin, polyether nitrile resin, polyether sulfone resin, polyethylene terephthalate resin, polyethylene naphthalate resin, and polyvinyl chloride resin. Preferably, polyimide resin is used.

The insulating base layer 3 has a thickness in the range of, for example, 1 to 35μm, or preferably 3 to 33 μm.

The conductive pattern 4 is formed as a wired circuit pattern including the head-side terminal 6, the external-side terminal 7, and the wire 8.

As shown in FIG. 1, a plurality of the head-side terminals 6 are, on the front end portion, disposed at spaced intervals to each other in the widthwise direction. Each of the head-side terminals 6 is formed into a generally rectangular shape in plane view that is long in the front-rear direction.

As shown in FIG. 2, a plurality of the external-side terminals 7 are, on the rear end portion, disposed at spaced intervals to each other in the widthwise direction. Each of the external-side terminals 7 is formed into a generally rectangular shape in plane view that is long in the front-rear direction.

As shown in FIG. 1, the wire 8 is formed so as to be continuous to the rear end portion of the head-side terminal 6 and the front end portion of the external-side terminal 7.

Examples of a conductive material for forming the conductive pattern 4 include copper, nickel, gold, solder, or alloys thereof. The conductive pattern 4 has a thickness in the range of, for example, 3 to 50 μm, or preferably 5 to 20 μm.

Each of the head-side terminals 6 and each of the external-side terminals 7 have a width (a length in the widthwise direction) in the range of, for example, 10 to 2060 μm, or preferably 20 to 560 μm. Each of the head-side terminals 6 and each of the external-side terminals 7 have a length (a length in the front-rear direction) in the range of, for example, 10 to 250 μm, or preferably 20 to 100 μm. Each of the head-side terminals 6 and each of the external-side terminals 7 have a surface area in the range of, for example, 2000 to 20000 μm$^2$, or preferably 2500 to 10000 μm$^2$.

A spacing between each of the head-side terminals 6 and a spacing between each of the external-side terminals 7 are in the range of, for example, 20 to 1000 μm, or preferably 30 to 800 μm.

The wire 8 has a width in the range of, for example, 5 to 200 μm, or preferably 8 to 100 μm.

As shown in FIGS. 4 and 5, the insulating cover layer 5 is formed on the upper surface of the insulating base layer 3 that is exposed from the conductive pattern 4 and on the upper surface and the side surfaces of the wire 8. The insulating cover layer 5 is formed so as to expose the head-side terminal 6 and the external-side terminal 7.

The insulating material for forming the insulating cover layer 5 includes the same insulating material as that for forming the insulating base layer 3. The insulating cover layer 5 has a thickness in the range of, for example, 2 to 20 μm, or preferably 4 to 15 μm.

Next, the rear end portion of the suspension board with circuit 1 is described in detail.

As shown in FIGS. 2, 4, and 5, in the rear end portion of the suspension board with circuit 1, base openings 11 corresponding to each of the external-side terminals 7, as an opening, are formed in the insulating base layer 3.

The base opening 11 is formed so as to penetrate in the thickness direction of the insulating base layer 3 and is formed into a generally rectangular shape in plane view that is long in the front-rear direction.

The external-side terminal 7 is filled in the base opening 11. That is, the external-side terminal 7 continuously includes a lower portion 22 that is filled in the base opening 11 of the insulating base layer 3 and an upper portion 23 that covers the upper surface of the insulating base layer 3 around the base opening 11 from the upper end of the lower portion 22. The upper portion 23 of the external-side terminal 7 protrudes from the upper end of the lower portion 22 toward the upper side, both sides in the front-rear direction, and both sides in the widthwise direction.

The base opening 11 has a width (a width of the lower portion 22 of the external-side terminal 7) in the range of 40 to 2000 μm, or preferably 60 to 1000 μm and has a length (a length of the lower portion 22 of the external-side terminal 7) in the range of, for example, 10 to 1000 μm, or preferably 30 to 600 μm.

On the rear end portion of the metal supporting board 2, a support terminal 13 is provided.

The support terminals 13 are formed, in the support opening 12, so as to correspond to each of the external-side terminals 7. That is, a plurality of the support terminals 13 are disposed at spaced intervals to each other in the widthwise direction. Each of the support terminals 13 is independent from each other and is formed into a generally rectangular shape in bottom view that is long in the front-rear direction.

The support terminal 13 is disposed at the inner side at spaced intervals to the inner circumference surface of the support opening 12 of the metal supporting board 2.

In this way, each of the support terminals 13 is electrically insulated from each other and the support terminal 13 is electrically insulated from the metal supporting board 2 around the support opening 12.

As shown in FIGS. 3 to 5, the support terminal 13 is, when projected in the thickness direction, overlapped with the external-side terminal 7. To be specific, each of the support terminals 13 is, when projected in the thickness direction, formed so as to be the same shape as that of the upper portion 23 of the external-side terminal 7.

In each of the support terminals 13, the circumference end portion (the both end portions in the front-rear direction and the both end portions in the widthwise direction) thereof is in contact with the lower surface of the insulating base layer 3 and the central portion thereof is in contact with the lower surface of the lower portion 22 of the external-side terminal 7.

In this way, each of the support terminals 13 is electrically connected to each of the external-side terminals 7, respectively.

The lower surface of the support terminal 13 has a surface resistance (20° C.) in the range of, for example, 10 to 100 Ω/☐, or preferably 20 to 80 Ω/☐. The surface resistance (the same as the following surface resistance) is measured with a surface resistance measurement device.

The suspension board with circuit 1 includes an electrically-conductive layer 14 that is formed on the lower surface of the support terminal 13 and a metal plating layer 15 that is formed on the lower surface of the electrically-conductive layer 14.

The electrically-conductive layer 14 is formed respectively on the entire lower surface of each of the support terminals 13.

Examples of an electrically-conductive material for forming the electrically-conductive layer 14 include a metal such as chromium, copper, molybdenum, tungsten, palladium, platinum, cobalt, titanium, zirconium, or alloys thereof (for example, nickel-chromium alloy (nichrome), chromium-molybdenum alloy, and the like); a carbon such as carbon black; and a polymer such as polyacetylene, polyaniline, and polypyrrole.

Preferably, the metal, or more preferably, chromium, copper, molybdenum, tungsten, and nichrome are used.

The specific resistance of these electrically-conductive materials is in the range of, for example, 1 to 100 μΩ·cm, or preferably, for example, 2 to 10 μΩ·cm.

These electrically-conductive materials can be used alone or in combination of two or more.

Preferably, two or more electrically-conductive materials are used in combination. To be specific, as shown in FIGS. 4 and 5, the electrically-conductive layer 14 includes a first electrically-conductive layer 16 and a second electrically-conductive layer 17.

The first electrically-conductive layer 16 is formed next to the lower surface of the support terminal 13. The first electrically-conductive layer 16 is made of at least one metal selected from the group consisting of chromium, molybdenum, tungsten, and nichrome.

The second electrically-conductive layer 17 is formed on the lower surface of the first electrically-conductive layer 16. The second electrically-conductive layer 17 is made of, for example, copper.

The electrically-conductive layer 14 has a thickness in the range of 10 nm or more to 200 nm or less, preferably 30 nm or more to 200 nm or less, or more preferably 50 nm or more to 100 nm or less.

The electrically-conductive layer 14 can also have a thickness in the range of, for example, 10 nm or more to 3 μm or less.

When the electrically-conductive layer 14 includes the first electrically-conductive layer 16 and the second electrically-conductive layer 17, the first electrically-conductive layer 16 has a thickness in the range of, for example, 10 nm or more to 90 nm or less, or preferably 15 nm or more to 80 nm or less and the second electrically-conductive layer 17 has a thickness in the range of, for example, 15 nm or more to 110 nm or less, or preferably 25 nm or more to 100 nm or less.

When the thickness of the electrically-conductive layer 14 (including the first electrically-conductive layer 16 and the second electrically-conductive layer 17) is within the above-described range, adhesion between the support terminal 13 and the metal plating layer 15 can be improved.

The metal plating layer 15 is a plating layer that is formed by a plating to be described later. The metal plating layer 15 is formed on the entire lower surface of the electrically-conductive layer 14. When the electrically-conductive layer 14 includes the first electrically-conductive layer 16 and the second electrically-conductive layer 17, the metal plating layer 15 is formed on the lower surface of the second electrically-conductive layer 17. That is, the metal plating layer 15 is formed next to the lower side of the second electrically-conductive layer 17.

In this way, the electrically-conductive layer 14 is interposed between the support terminal 13 and the metal plating layer 15.

An example of the metal for forming the metal plating layer 15 includes the electrically-conductive material such as gold, nickel, chromium, or alloys thereof.

The specific resistance (20° C.) of the above-described metal is in the range of, for example, 0.1 to 1000 μΩ·cm, or preferably 1 to 100 μΩ·cm.

These metals can be used alone or in combination of two or more.

When the above-described metal is used alone, preferably, gold (the specific resistance (20° C.): 2.5 μΩ·cm, the specific resistance (0° C.): 2.19 μΩ·cm) is used. That is, the metal plating layer 15 is defined as a gold plating layer.

When two or more above-described metals are used in combination, preferably, gold and nickel (the specific resistance (20° C.): 6.9 μΩ·cm, the specific resistance (0° C.): 6.9 μΩ·cm) are used in combination. That is, the metal plating layer 15 is defined as the gold plating layer and a nickel plating layer. In that case, the nickel plating layer is formed on the lower surface of the electrically-conductive layer 14 and the gold plating layer is formed on the lower surface of the nickel plating layer.

The metal plating layer 15 has a thickness in the range of, for example, 0.01 to 10 μm, or preferably 0.1 to 1 μm.

The metal plating layer 15 has a surface resistance (20° C.) in the range of, for example, 10 to 100 Ω/□, or preferably 20 to 80 Ω/□.

Next, a method for producing the suspension board with circuit 1 is described with reference to FIG. 6.

As referred in FIG. 6 (*a*), in this method, the metal supporting board 2 in a plate shape extending in the lengthwise direction is first prepared.

Next, the insulating base layer 3 is formed on the metal supporting board 2 so as to form the base opening 11.

To form the insulating base layer 3, for example, a solution (varnish) of a photosensitive synthetic resin is applied onto the metal supporting board 2 to form a photosensitive base film. Thereafter, the base film is exposed to light and is then developed to form the above-described pattern. Subsequently, the base film is heat cured as required.

Next, the conductive pattern 4 is formed on the insulating base layer 3 with the above-described pattern corresponding to the head-side terminal 6, the external-side terminal 7, and the wire 8. The external-side terminal 7 is formed so that the lower portion 22 is filled in the base opening 11 of the insulating base layer 3 and the upper portion 23 protrudes from the upper end of the lower portion 22.

To form the conductive pattern 4, for example, a known patterning method such as an additive method is used.

Next, the insulating cover layer 5 is formed on the insulating base layer 3 so as to cover the conductive pattern 4. For example, a photosensitive synthetic resin is applied onto the insulating base layer 3 including the conductive pattern 4 to form a photosensitive cover film. Thereafter, the cover film is exposed to light and is then developed to form the above-described pattern. Subsequently, the cover film is heat cured as required.

Next, as shown in FIG. 6 (*b*), the electrically-conductive layer 14 is formed on the entire lower surface of the metal supporting board 2.

An example of a method for forming the electrically-conductive layer 14 includes a thin film forming method such as a vacuum deposition and a plating. Preferably, the vacuum deposition is used.

The vacuum deposition is the method in which, in a state where the environment of the suspension board with circuit 1 in the process of the production is set to be in a vacuum atmosphere, the above-described electrically-conductive material is vaporized to be adhered onto the entire lower surface of the metal supporting board 2. The electrically-conductive layer 14 formed by the vacuum deposition is defined as a deposition layer.

In the vacuum deposition, the electrically-conductive layer 14 can be formed with the above-described specific thickness.

Examples of the vacuum deposition include a sputter deposition (sputtering), a resistance heating deposition, an electron beam heating deposition, and an ion plating. Preferably, the sputtering is used When the electrically-conductive layer 14 including the first electrically-conductive layer 16 and the second electrically-conductive layer 17 is formed, after forming the first electrically-conductive layer 16 on the entire lower surface of the metal supporting board 2 by the above-described thin film forming method, the second electrically-conductive layer 17 is formed on the entire lower surface of the first electrically-conductive layer 16 by the above-described thin film forming method.

Next, as shown in FIG. 6 (c), a plating resist 19 is formed on the lower surface of the metal supporting board 2 in a pattern reverse to that of the support terminals 13.

Next, as shown in FIG. 6 (d), the metal plating layer 15 is formed on the lower surface of the electrically-conductive layer 14 that is exposed from the plating resist 19 by the plating.

Examples of the plating include an electrolytic plating and a non-electrolytic plating. Preferably, the non-electrolytic plating is used.

When the metal plating layer 15 is made of gold, the gold plating layer is formed on the lower surface of the electrically-conductive layer 14 that is exposed from the plating resist 19 by a gold plating (preferably, a non-electrolytic gold plating).

When the metal plating layer 15 is made of gold and nickel, for example, the nickel plating layer is formed on the lower surface of the electrically-conductive layer 14 that is exposed from the plating resist 19 by a nickel plating (preferably, a non-electrolytic nickel plating) and then, the gold plating layer is formed on the entire lower surface of the nickel plating layer by the gold plating (preferably, the non-electrolytic gold plating).

In addition, the metal plating layer 15 is also formed on the upper surfaces of the head-side terminal 6 and the external-side terminal 7 that are exposed from the insulating cover layer 5.

Next, as shown in FIG. 6 (e), the plating resist 19 is removed by, for example, an etching, a peeling, or the like.

Next, as shown in FIG. 6 (f), the electrically-conductive layer 14 that is exposed from the metal plating layer 15 is removed by, for example, a soft etching in which an etchant such as potassium persulfate or sodium persulfate is used. At this time, the metal plating layer 15 serves as an etching resist and is not removed by the soft etching. Alternatively, the thickness of the metal plating layer 15 is sufficiently thicker than that of the electrically-conductive layer 14, so that the metal plating layer 15 is not substantially removed by the soft etching.

Thereafter, the slit 21 (ref: FIG. 1) and the support opening 12 (ref: FIG. 3) are formed by, for example, the etching, a drill boring, or a laser processing. At the same time with this, the metal supporting board 2 is cut out along an outer shape thereof.

The suspension board with circuit 1 is obtained in this manner.

Thereafter, as shown in phantom lines in FIG. 1, the slider 9 mounted with the magnetic head is mounted on the obtained suspension board with circuit 1. At the same time with this, the magnetic head is electrically connected to the head-side terminal 6.

Then, the inspection of the conduction of the conductive pattern 4 and the inspection of the performance of the magnetic head are performed with an inspection device 10 (as shown in phantom lines in FIGS. 1, 4, and 5).

To be specific, as shown in FIGS. 4 and 5, the inspection device 10 is disposed below the suspension board with circuit 1. Then, a probe 18 of the inspection device 10 comes into contact with the lower surface of the metal plating layer 15. The distal end surface (the upper surface) of the probe 18 is formed smaller than the support terminal 13 and has a surface area in the range of, for example, 400 to 10000 $\mu m^2$, or preferably 1000 to 2500 $\mu m^2$.

In this way, the probe 18 and the conductive pattern 4 are conducted to each other.

An inspection signal (an inspection current) is transmitted from the probe 18 to the conductive pattern 4 via the metal plating layer 15 and the electrically-conductive layer 14 and further, to the magnetic head. In this way, the presence or absence of the conduction of the conductive pattern 4 and the non-defect/defect in performance of the magnetic head are inspected.

Thereafter, after the probe 18 of the inspection device 10 is separated from the metal plating layer 15, an external terminal (not shown) of an external board such as a flexible wired circuit board is electrically connected to the external-side terminal 7. The external board is disposed above the external-side terminal 7 and the external terminal of the external board comes into contact with the upper surface of the external-side terminal 7.

According to the suspension board with circuit 1, the external-side terminal 7 is filled in the base opening 11 of the insulating base layer 3; in the metal supporting board 2, the support terminal 13 electrically insulated from the surrounding metal supporting board 2 and electrically connected to the external-side terminal 7 is formed; and the metal plating layer 15 is formed below the support terminal 13, so that it is possible to ensure excellent conductivity between the probe 18 and the support terminal 13 and to inspect the conduction of the conductive pattern 4 and the performance of the magnetic head by allowing the probe 18 of the inspection device 10 to come into contact with the lower surface of the metal plating layer 15 from the lower side thereof.

The electrically-conductive layer 14 with a specific thickness is interposed between the support terminal 13 and the metal plating layer 15, so that the adhesion between the support terminal 13 and the metal plating layer 15 can be improved.

Therefore, it is possible to prevent that the metal plating layer 15 peels off from the support terminal 13.

As a result, it is possible to improve the reliability of the inspection of the conduction of the conductive pattern 4 and the performance of the magnetic head.

On the other hand, in a case where the metal plating layer 15 is formed on the lower surface of the support terminal 13 without the formation of the electrically-conductive layer 14, when the support terminal 13 is made of stainless steel, it is necessary to perform a strike plating (a brief plating by using an etchant having a notably high corrosion strength (for example, copper sulfate solution and the like)) so as to peel off a passive film that lies on the lower surface of the support terminal 13, and then to form the metal plating layer 15 by a metal plating. At the time of the strike plating, a hydrogen gas is generated on the lower surface of the support terminal 13 and the surrounding plating resist 19 (ref: FIG. 6 (c)) easily peels off due to the hydrogen gas.

However, when the electrically-conductive layer 14 (preferably, the deposition layer) is formed (preferably, formed by the vacuum deposition) on the lower surface of the support terminal 13, the above-described hydrogen gas is not generated, so that a peeling of the plating resist 19 can be prevented.

Furthermore, the electrically-conductive layer 14 having a specific surface resistance is interposed between the support terminal 13 and the metal plating layer 15, so that, when the probe 18 comes into contact with the support terminal 13 and the inspection current flows through the support terminal 13, it is possible to effectively reduce the heat generation caused by the flowing of the current. Therefore, the above-described inspection can be performed stably.

When the metal plating layer 15 is the gold plating layer, the conductivity between the probe 18 and the metal plating layer 15 can be improved. When the metal plating layer 15 includes the above-described nickel plating layer and gold plating layer, it is possible to improve the conductivity with the probe 18 and to improve the adhesion with the electrically-conductive layer 14 by the gold plating layer.

EXAMPLE

While the present invention will be described hereinafter in further detail with reference to Examples and Comparative Example, the present invention is not limited to these Examples and Comparative Example.

Example 1

(Electrically-Conductive Layer: First Electrically-Conductive Layer Made of Chromium and Second Electrically-Conductive Layer Made of Copper)
(Metal Plating Layer: Gold Plating Layer)

A metal supporting board made of stainless steel (SUS304, specific resistance (20° C.) 76 µΩ·cm) having a thickness of 25 µm was prepared.

Next, an insulating base layer was formed on the metal supporting board with a pattern in which a base opening was formed. That is, a varnish of a photosensitive polyamic acid resin was applied onto the metal supporting board to form a photosensitive base film. Thereafter, the base film was exposed to light and was then developed to form the above-described pattern. Subsequently, the base film was heat cured.

The insulating base layer had a thickness of 20 µm. The base opening had a length of 600 µm, a width of 600 µm, and an opening area of 360000 µm$^2$.

Next, a conductive pattern made of copper including a head-side terminal, an external-side terminal, and a wire was formed on the insulating base layer by an additive method. The external-side terminal was formed so as to continuously include a lower portion that was filled in the base opening of the insulating base layer and an upper portion that covered the upper surface of the insulating base layer around the base opening from the upper end of the lower portion.

The conductive pattern had a thickness of 10 µm. The head-side terminal and (the upper portion of) the external-side terminal had a length of 40 µm and a width of 200 µm.

Next, an insulating cover layer was formed on the insulating base layer so as to cover the conductive pattern. That is, a photosensitive synthetic resin was applied onto the insulating base layer including the conductive pattern to form a photosensitive cover film. Thereafter, the cover film was exposed to light and was then developed to form the above-described pattern. Subsequently, the cover film was heat cured. The insulating cover layer had a thickness of 5 µm.

Next, an electrically-conductive layer was formed on the entire lower surface of the metal supporting board as a deposition layer (ref: FIG. 6 (b)).

To be specific, a first electrically-conductive layer made of chromium having a thickness of 30 nm was first formed on the lower surface of the metal supporting board by a chromium sputtering.

Subsequently, a second electrically-conductive layer made of copper having a thickness of 70 nm was formed on the lower surface of the first electrically-conductive layer by a copper sputtering.

Next, a plating resist was formed on the lower surface of the metal supporting board in a pattern that is reverse to that of support terminals (ref: FIG. 6 (c)).

Next, a metal plating layer made of gold was formed, as a gold plating layer, on the lower surface of the electrically-conductive layer that was exposed from the plating resist by a non-electrolytic gold plating. The metal plating layer had a thickness of 0.5 µm (ref: FIG. 6 (d)).

Next, the plating resist was removed by an etching (ref: FIG. 6 (e)).

Next, the electrically-conductive layer that was exposed from the metal plating layer was removed by a soft etching (ref: FIG. 6 (f)).

Thereafter, a slit (ref: FIG. 1) and a support opening (ref: FIG. 3) were formed by the etching and the metal supporting board was cut out along an outer shape thereof.

A suspension board with circuit was obtained in this manner (ref: FIG. 1).

When a surface resistance (a surface resistance right after being formed or being prepared) of the lower surfaces of the metal supporting board and the metal plating layer was measured, the result was 42.8 Ω/□ and 41.6 Ω/□, respectively.

The surface resistance was measured with the temperature of 25° C. and the humidity of 15% by using a surface resistance measurement device (manufactured by Mitsubishi Chemical Corporation, Hiresta-UP MCP-HT450).

Example 2

(Electrically-Conductive Layer: First Electrically-Conductive Layer Made of Chromium and Second Electrically-Conductive Layer Made of Copper)
(Metal Plating Layer: Nickel Plating Layer and Gold Plating Layer)

A suspension board with circuit was obtained by being processed in the same manner as in Example 1 except that the metal plating layer made of gold and nickel was formed instead of the metal plating layer made of gold.

That is, in the formation of the metal plating layer, first, a nickel plating layer was formed on the lower surface of the electrically-conductive layer that was exposed from the plating resist by a non-electrolytic nickel plating. Subsequently, the gold plating layer was formed on the lower surface of the nickel plating layer by the non-electrolytic gold plating.

The nickel plating layer had a thickness of 0.25 µm. The gold plating layer had a thickness of 0.25 µm.

When the surface resistance (the surface resistance right after being formed or being prepared) of the lower surfaces of the metal supporting board and the gold plating layer was measured, the result was 42.8 Ω/□ and 41.6 Ω/□, respectively.

Comparative Example 1

(Electrically-Conductive Layer: Not Present)
(Metal Plating Layer: Gold Plating Layer)

A suspension board with circuit was obtained by being processed in the same manner as in Example 1 except that the electrically-conductive layer was not formed (ref: FIG. 1).

When the surface resistance (the surface resistance right after being formed; as for the metal supporting board, the surface resistance of the lower surface after being subjected to the strike plating) of the lower surfaces of the metal supporting board and the metal plating layer was measured, the result was 42.8 Ω/□ and 41.6 Ω/□, respectively.

(Evaluation of Adhesion)
1. Peel Test

A peel test at 90° C. (peeling speed: 25 mm/min) was performed as follows: in a state where an adhesive tape (Nitto 5000 Ns) was attached onto the entire lower surface of the suspension board with circuit in Examples 1 and 2 and the suspension board with circuit was fixed, the adhesive tape was peeled off.

Thereafter, the presence or absence of a peeling of the metal plating layer was observed.

As a result, in the suspension board with circuit in Examples 1 and 2, the peeling of the metal plating layer was not observed.

As for the suspension board with circuit in Comparative Example 1, the peel test was attempted to be performed. However, the peeling of the metal plating layer was already generated.

2. Ultrasonic Test

The suspension board with circuit in Examples 1 and 2 was dipped in water at 50° C. and the ultrasonic wave was applied to the suspension board with circuit using an ultrasonic generating device.

As a result, in the suspension board with circuit in Examples 1 and 2, the peeling of the metal plating layer was not observed.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
    a metal supporting board;
    an insulating layer formed on the metal supporting board having an opening penetrating in the thickness direction formed therein; and
    a conductive pattern formed on the insulating layer including a head-side terminal electrically connected to a magnetic head, an external-side terminal, and a wire connected to the head-side terminal and the external-side terminal, wherein
    the external-side terminal is filled in the opening of the insulating layer, and
    in the metal supporting board, a support terminal electrically insulated from the surrounding metal supporting board and electrically connected to the external-side terminal is provided, wherein
    the suspension board with circuit includes a metal plating layer formed below the support terminal and
    an electrically-conductive layer interposed between the support terminal and the metal plating layer having a thickness of 10 nm or more to 200 nm or less.

2. The suspension board with circuit according to claim 1, wherein the electrically-conductive layer is made of a metal and is a deposition layer that is formed by a vacuum deposition method.

3. The suspension board with circuit according to claim 1, wherein the electrically-conductive layer is made of at least one metal selected from the group consisting of chromium, copper, molybdenum, tungsten, and nichrome.

4. The suspension board with circuit according to claim 1, wherein
    the electrically-conductive layer includes a first electrically-conductive layer that is made of at least one metal selected from the group consisting of chromium, molybdenum, tungsten, and nichrome and is next to the support terminal, and
    a second electrically-conductive layer that is made of copper and is formed below the first electrically-conductive layer so as to be next to the metal plating layer.

5. The suspension board with circuit according to claim 1, wherein the metal supporting board is made of stainless steel.

6. The suspension board with circuit according to claim 1, wherein the metal plating layer is made of gold and/or nickel.

7. The suspension board with circuit according to claim 1, wherein the metal plating layer includes a gold plating layer.

* * * * *